United States Patent [19]

Miyazaki et al.

[11] Patent Number: 5,309,109
[45] Date of Patent: May 3, 1994

[54] FORCIBLE GROUNDING GENERATION EQUIPMENT AND GROUNDING OCCURRENCE DETECTION EQUIPMENT USING THE SAME

[75] Inventors: Terunobu Miyazaki, Ibaraki; Kazuo Nishijima, Katsuta, both of Japan

[73] Assignee: Hitachi, Ltd., Tokyo, Japan

[21] Appl. No.: 846,680

[22] Filed: Mar. 5, 1992

[30] Foreign Application Priority Data

Mar. 7, 1991 [JP] Japan ................................. 3-041569

[51] Int. Cl.$^5$ ............................................. G01R 31/14
[52] U.S. Cl. .................................... 324/509; 340/680
[58] Field of Search ............... 324/509, 520, 521, 127, 324/126; 361/47, 48, 76, 79; 340/650, 651

[56] References Cited

U.S. PATENT DOCUMENTS 1,055,018  3/1913  Burnham ............................. 340/651
3,287,636  11/1966  Gagniere ............................. 324/509

Primary Examiner—Walter E. Snow
Attorney, Agent, or Firm—Antonelli, Terry, Stout & Kraus

[57] ABSTRACT

By forcibly grounding a selected one of three phases of a three-phase power distribution line, a higher line-to-ground voltage is applied to other phases thereby causing very small-scale grounding at a fault position so that the fault position can be specified by detecting the small-scale grounding current as generated.

5 Claims, 9 Drawing Sheets

FORCIBLE GROUNDING GENERATION EQUIPMENT AND GROUNDING OCCURRENCE DETECTION EQUIPMENT USING THE SAME

BACKGROUND OF THE INVENTION

1. Field of the Invention

The present invention relates to very small-scale ground occurrence detection equipment, and more particularly to very small-scale ground occurrence detection equipment capable of detecting very small-scale grounding in a distribution power system while maintaining the line energized.

2. Description of Related Art

When deterioration occurs in any equipment or materials in a distribution line, it is required to quickly identify, out of many electric poles, the equipment or materials thereof where it is actually occurring, thereby to remedy it.

For this purpose, deterioration inspecting methods have been proposed, for example, in "Electric Review" January, '90, p 46, "Electric Joint Research", vol. 42, no. 1, p 23 and "Japan Electric Association", 68th General Session, Research Report p. 114–115, in which the distribution line is divided into a plurality of zones by switches and the zones are successively inspected for identifying the defective zone by interrupting a power supply to the zone to be inspected and applying a high tension pulse between the zone and the ground.

Further, there are proposed detection methods in "Electric Joint Research", vol. 42, no. 1, p-35 or in "Electric Joint Research", vol. 43, no. 2, p-204 to 205 for detecting ultrasonic noises or high frequency noises occurring from a discharge-type deterioration point using microphone or antenna.

The former methods hereinabove are implemented on the premise that the defective line must be specified in advance. In addition, the detection of the defective zone must be performed under outage of the power, resulting in inconvenience of the users.

The latter methods hereinabove are implemented under live wire condition thereby eliminating the inconvenience of the users due to outage of power imposed at any time when the inspection is required. However, they are effective only when the discharge-type ground fault phenomena in the degraded equipment or materials continue under a normal line voltage. Namely, according to these methods, the detection of deterioration is possible only when the deterioration has progressed to such an extent as to cause discharge phenomena to occur under the normal line voltage. Thus, the methods are contrary to the object of the present invention to detect any deterioration in equipment and materials at its earlier stage of occurrence.

SUMMARY OF THE INVENTION

An object of the present invention is to provide very small-scale ground occurrence detection equipment capable of detecting very small scale grounding in a power distribution system without interrupting service of power by the distribution line, i.e., under live wire condition.

Another object of the present invention is to provide very small-scale ground occurrence detection equipment capable of locating and specifying a defective zone and a specific place where a very small-scale grounding is occurring.

Still another object of the present invention is to provide grounding generation equipment suitable to generate grounding in the system under live wire condition.

In order to accomplish the above objects, in the present invention, very small-scale grounding of a power distribution line is detected under live wire condition thereof by, while unchanging the line-to-line voltage in the power distribution line operated under normal condition, increasing the line-to-ground voltage thereof for a short period of time thereby applying a higher line-to-ground voltage to the distribution line.

During such operation, any site where very small-scale grounding is occurring is identified from the information received from respective zones on the distribution line.

Further, in order to induce grounding in the power line under live wire condition, a grounding switch is provided between one phase of the distribution line and the ground.

By grounding one phase of the distribution line, two phases other than the grounded one become greater in their voltages relative to the ground in comparison with the normal line-to-ground voltage, thus readily causing a ground fault in the degraded equipment or materials, so that very small-scale grounding, which would hardly progress to ground fault under the normal voltage, can be detected at its earlier stage.

BRIEF DESCRIPTION OF THE DRAWINGS

FIGS. 8A and 8B show another circuit block diagram and a vector diagram similar to those of FIGS. 7A and 7B, respectively.

FIGS. 9A and 9B show still another circuit block diagram and a vector diagram similar to those of FIGS. 7A and 7B, respectively.

DESCRIPTION OF THE PREFERRED EMBODIMENTS

Power distribution system to which the present invention is applicable, and a schematic diagram of equipment embodying the present invention will be explained in the following.

Figures 1, 2:
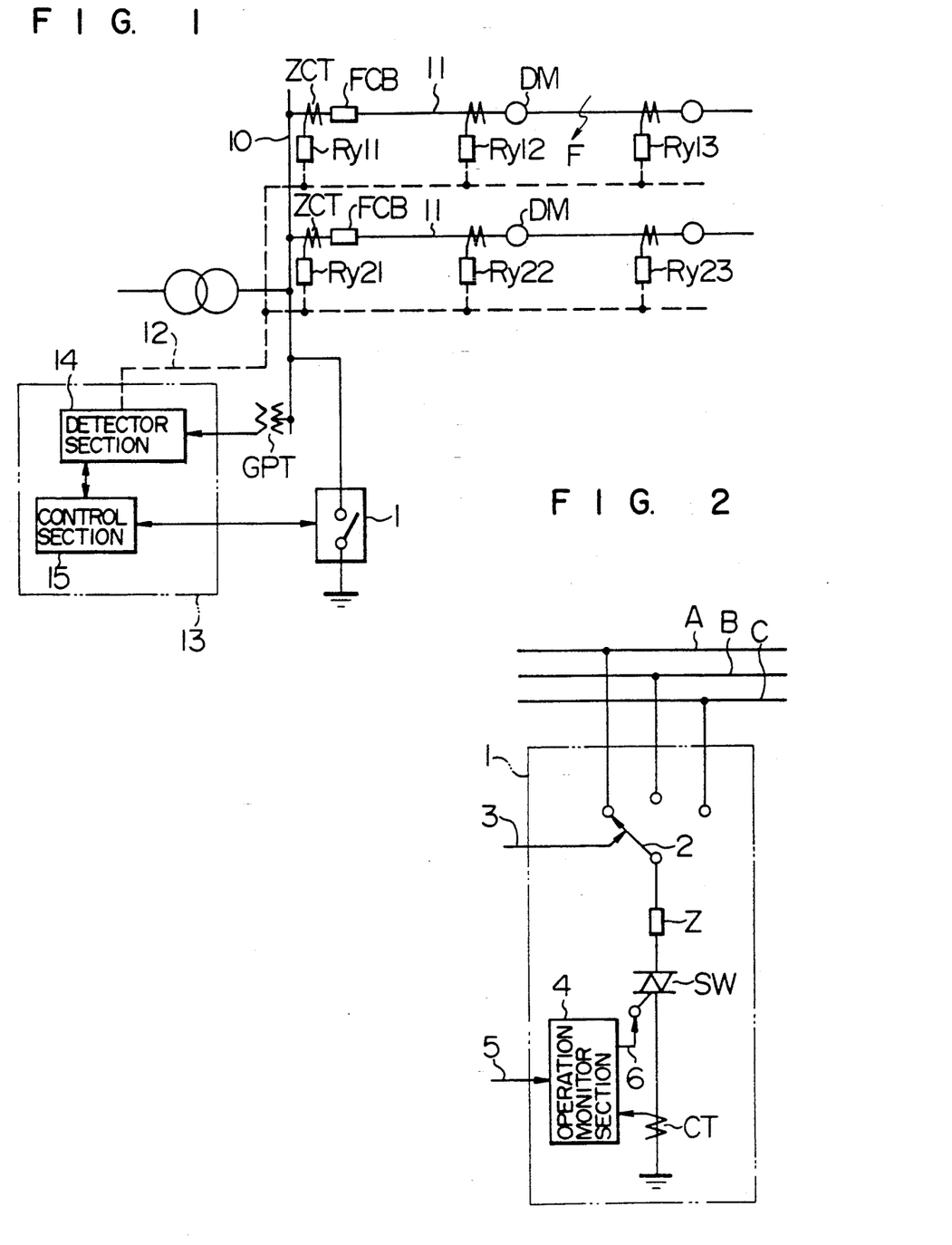
FIG. 1 shows a schematic block diagram of equipment according to the present invention applied to a known distribution system including distribution lines.
FIG. 2 shows an exemplary circuit configuration of forcible grounding equipment embodying the invention.

With reference to FIG. 1, numeral 10 designates a distribution substation bus bar to which respective three-phase distribution lines 11 are connected via a circuit breaker FCB. The three-phase distribution line may be of the grounded neutral or non-grounder neutral type Disconnect switches DM are placed in each of the zones into which each distribution line is divided. Further in the vicinities of circuit breakers FCB and disconnect switches DM, there are provided detectors for detecting a ground fault such as, for example, zero-phase current transformers ZCT, and protective relays Ry for ground fault detection. Any ground fault detection signals detected by respective protective relays are transmitted to a control unit 13 through a communication cable 12. Otherwise, a zero-phase voltage appearing on a tertiary open delta winding in a grounding transformer GPT provided on the substation bus bar 10 is transmitted to the control unit 13.

A detector section 14 in the control unit 13 is capable of detecting a ground fault when it occurs from the signals received, for example, detecting the distribution line and the location thereof where the ground fault has occurred based on the ground fault detection signals from the protective relays Ry. It is also capable of determining, from the phase of a zero-phase voltage appearing on the tertiary open delta winding in the grounding transformer, the phase of the line in which the ground fault has occurred. A control section 15 specifies the phase to be forcibly grounded and gives a forcible grounding instruction to a forcible grounding section 1. Responding to this instruction, the forcible grounding section 1 causes the specified grounding phase to be grounded for several cycles.

FIG. 2 shows exemplary forcible grounding equipment 1 embodying the present invention. In FIG. 2, A, B and C designate respective phases in the distribution line. Numeral 2 designates a ground phase select switch for selecting a phase to be forcibly grounded, which is connected to one of the phases in accordance with a phase selection instruction 3 from the above-mentioned control unit 13. Numeral 4 designates an operation monitor section whereby timing of forced grounding is controlled, and which upon reception of a grounding start instruction 5 gives open/close instruction 6 to a static type grounding switch SW. Z is an impedance including a resistance or reactance. By choosing its magnitude appropriately, it is possible to select the magnitude of a line-to-ground voltage at the phases other than that which is forcibly grounded. In addition, it is effective to suppress the fault current when a serious ground fault (two-phase grounding) has occurred at the degraded sites. CT indicates a current transformer which monitors a current flowing through the forcible grounding unit 1. When no ground fault occurs at any degraded points, normally there flows only a current corresponding to a charging current of the system through the current transformer CT. The current, however, increases when the degraded points develop to a ground fault. A signal indicative of the current of the transformer CT is supplied through the section 4 to the control section 15. The control section 4 monitors the current of the transformer CT, and opens the grounding switch SW immediately when it detects that the current exceeds a preset value corresponding to the charging current of the system.

According to the present invention, as can be clearly understood with reference to the circuit configurations in FIGS. 1 and 2, by forcibly grounding one of the phases in the three-phase distribution line a voltage much higher than normal operational voltage is applied to at least one of the other phase. Under such circumstances, an extremely small grounding that will hardly be discovered under normal voltage operation may develop to a ground fault through application of the higher voltage. By detecting this ground current the embodiment of the invention determines whether there exists any extremely small grounding, and, if so, specifies its location.

Figure 3A:
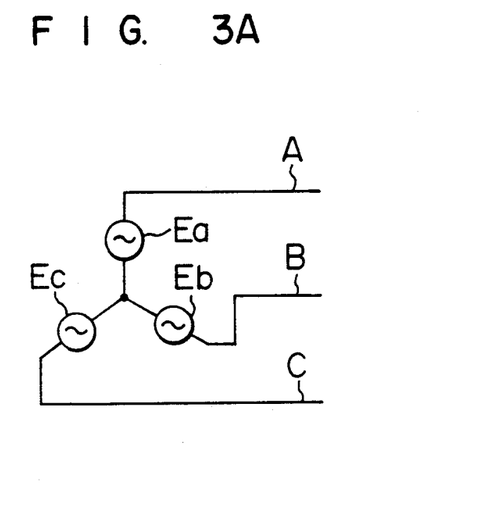
FIGS. 3A to 3D show a circuit configuration of a three-phase distribution line and line-to-ground voltages of respective phases under normal operation condition and forced grounding condition, respectively.
Figure 3B:
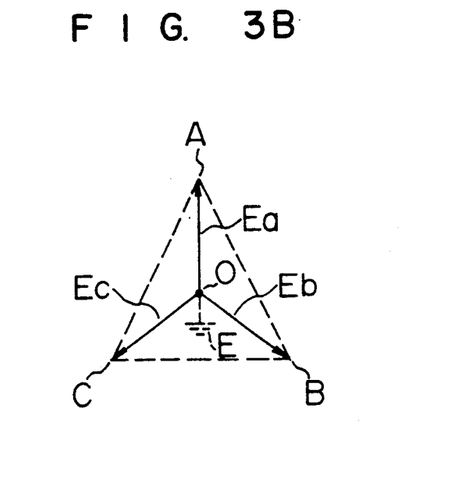
Figure 3C:
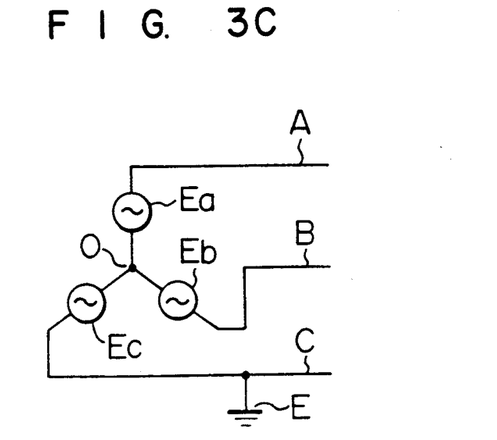
Figure 3D:
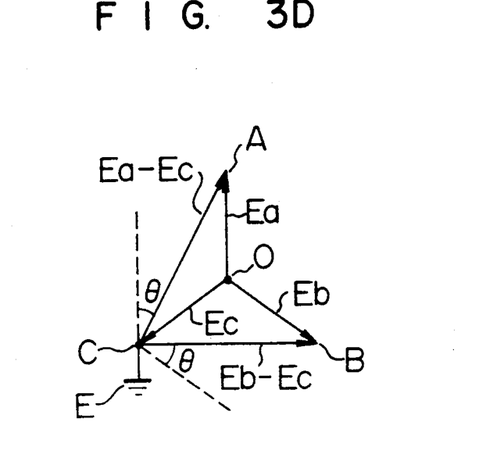

FIGS. 3A to 3D show the differences of the distribution line circuit configuration and the voltage vectors of the resultive phases between the normal operation and the forced grounding operation, wherein FIG. 3A indicates the distribution line circuit configuration under normal operation, FIG. 3C indicates the distribution line circuit configuration under forced grounding operation, FIG. 3B indicates voltage vectors of the respective phases under normal operation, and FIG. 3D indicates voltage vectors of the respective phases under forced grounding operation. It can be clearly known from both FIGS. 3A and 3C that although neutral point 0 in normal distribution line is not grounded, its voltage is approximately 0 V, and respective phase voltages of the three phases are balanced, with a phase difference of 120 degrees between two phases and equal phase voltages. Further, in case the phase C is forcibly grounded, as is clearly known from FIGS. 3C and 3D, the line-to-ground voltage of the phase A changes from Ea before the forced grounding to Ea-Ec at the forced grounding, the line-to-ground voltage of the phase B changes from Eb before the forced grounding to Eb-Ec and the voltage of the phase C becomes zero. Incidentally, Ea, Eb and Ec indicates vector quantities of the respective phase voltages. The voltage Ea-Ec has a magnitude of $\sqrt{3}$ times of the voltage Ea before the forced grounding and a phase lagging by 30 degrees from the phase of the voltage Ea, while the voltage Eb-Ec has a magnitude of $\sqrt{3}$ times of the voltage Eb before the forced grounding and a phase leading by 30 degrees from the phase of the voltage Eb. Further, as can be clearly known from the vector diagrams, the line-to-line voltages between every two of the phases A, B and C do not change even by the forced grounding thereby causing no trouble in service operation.

Figure 4:
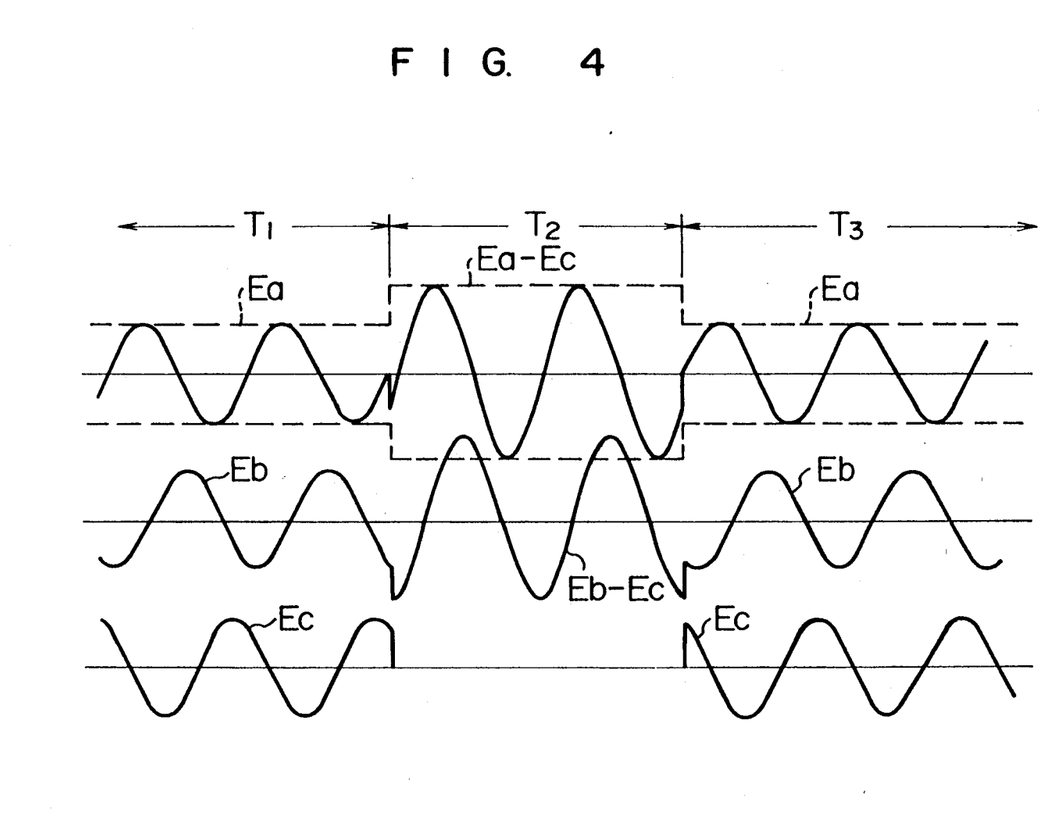
FIG. 4 shows time variation of the line-to-ground voltages of the respective phases under forced grounding condition.

FIG. 4 shows the time variation in the magnitude of the line-to-ground voltages of the respective phases. The line-to-ground voltage is Ea during T1 and T2 under normal operation and becomes $\sqrt{3}$ times as large as Ea during T3 under the forced grounding operation. More particularly, in case of 6.6 kV distribution line, the line-to-ground voltage of each phase is 3810 V during normal operation periods T1 and T3. Further, when C phase is grounded (T2), the line-to-ground voltages of the A and B phases become 6600 V The maximum peak value of the line-to-ground voltage is 5388 V under normal operation and 9334 V under forced grounding.

Figure 5:
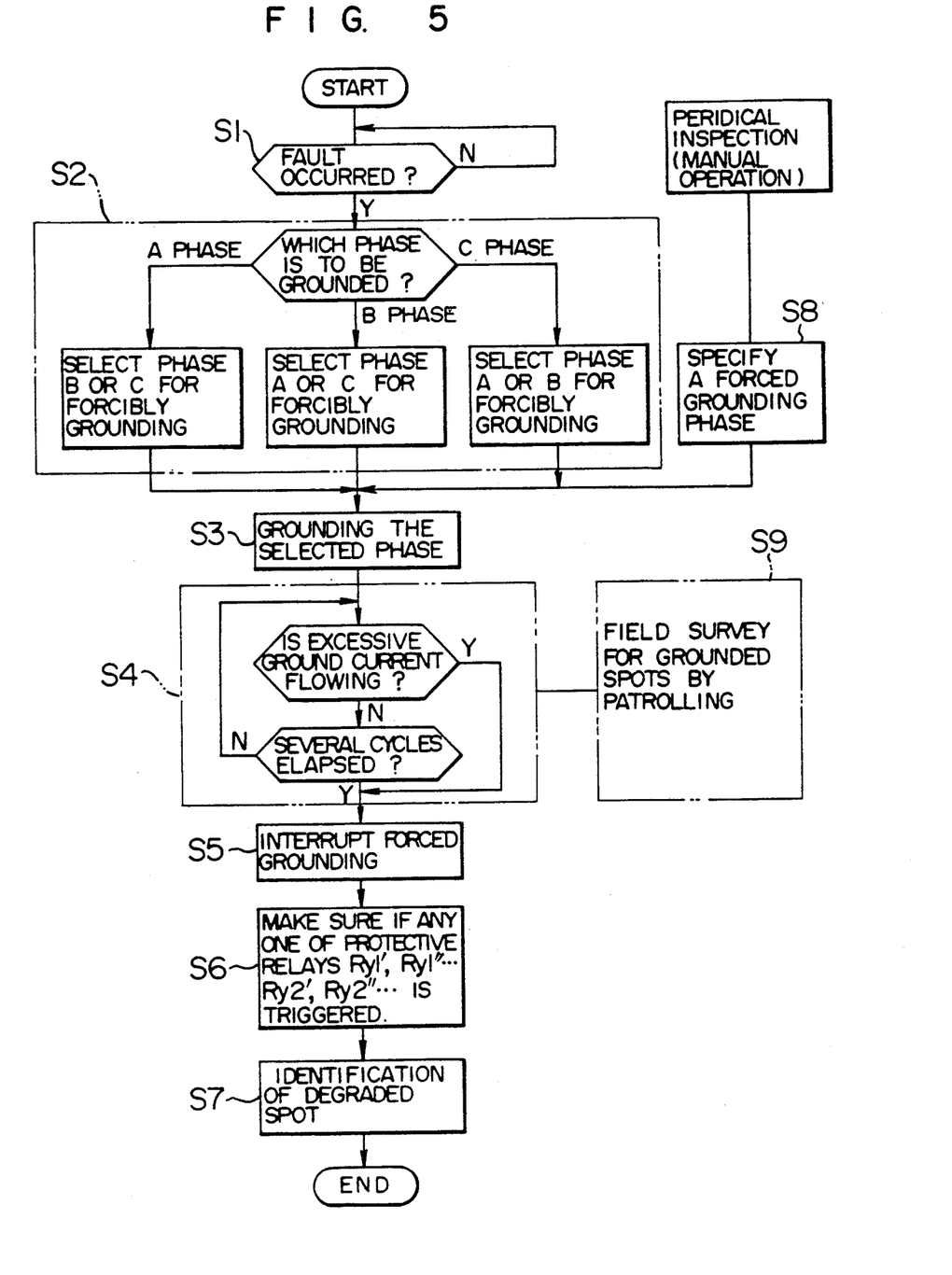
FIG. 5 shows a flowchart of control process carried out by an embodiment of the invention.

Hereinabove, there have been described the line-to-ground voltages of the two phases other than that which is forcibly grounded. In this case, however, the line-to-ground voltage during the grounding operation is lowered than the above-mentioned value by forcibly grounding the phase through a suitable impedance. In the contrary, it is also possible to increase its value higher than the above-mentioned value by inserting an appropriate voltage having a selected magnitude and a phase into the forcible grounding circuitry. These circuitry configuration embodying the present invention will be explained in detail later with reference to the accompanying drawings FIG. 5 shows a process flow-chart block diagram describing the detail of control to be performed by the control section 15 in the control unit 13 in FIG. 1. With reference to this flow-chart, the technique of the very small-scale grounding detection method according to the present invention will be described in detail.

This process flowchart is started basically under two trigger conditions. One is by manual starting, which is started at the time when the operator himself specifies a ground phase to be grounded forcibly at a periodical inspection or the like (step S8). The other one is by automatic starting, which is effected by the operation of a protective relay(s) provided at the load side of the FCB for tripping the FCB upon occurrence of a fault in the distribution line (step S1). This protective relay(s) is preferred to have a high sensitivity such that it can detect an extremely small grounding, and is triggered when a pulse-like zero-phase current (or voltage) is detected in monitoring of the distribution line. Further, it is preferable that these protective relays be provided for each phase.

Next, in step S2, after operation recovery of the triggered protective relay, the grounding phase is selected to be grounded forcibly so as to increase the line-to-ground voltage of the phase detected. That is, when a zero-phase current in pulse form is observed, for example, on the phase A and a protective relay on the same phase has operated, the phase B or C will be selected as a grounding phase. According to the inventive arrangements, any phase other than the phase in which the very small grounding has been observed is selected as a forced grounding phase. Further, with respect to steps S1 and S2, some alternatives are available to be adopted. One of them is to select any two phases in sequence at an appropriate time, irrespective of the occurrence of any small-scale grounding. In this case, a simpler configuration than that of FIG. 5 is capable of being provided though its detection probability is slightly reduced. By selecting any two phases in sequence to be grounded forcibly, and from their detection responses, it is possible to determine which phase the very small-scale grounding has occurred, if any. Further, it is also effective to detect existence of any small-scale grounding occurring in the system at first without specifying its phase, then to forcibly grounding any pairs of two phases sequentially to be grounded forcibly.

In step S3, a ground phase select instruction 3 is given to the forcible grounding equipment 1 shown in FIG. 2 to drive the ground phase select switch 2. At the same time, a grounding start instruction 5 is given to the operation monitor section 4 to transmit a switching instruction 6 to the grounding switch SW thereby to turn on the switch into conduction state. Consequently, the line-to-ground voltage of any phase other than the grounded phase jumps $\sqrt{3}$ times as large as the normal. During such operations, the distribution line is maintained as energized without causing any inconvenience to load operation, which is the features of the present invention.

A ground current at grounding is monitored by current transformer CT as shown in FIG. 2, and its output is entered into the controller section 15 in FIG. 1 through the operation monitor section 4. The controller section 15 monitors at step S4 the magnitude of the grounding current When the grounding current exceeds a predetermined value, as it indicates a greater probability of occurrence of a short circuit (when small-scale grounding occurs at a plurality of positions, the grounding may occur at two or more positions at the same time, resulting in a short circuit), the step advances to S5 to immediately interrupt the forced grounding so as to assure safety in the distribution line. When the ground current is in the normal range, the step advances to S5 after an elapse of a predetermined period of time.

As shown in FIG. 1, there are provided zero-phase-current transformers ZCT and protective relays Ry for detecting any ground-fault, in the vicinity of disconnect switches DM disposed in appropriate locations on respective distribution lines. The information of their operation and a specific identification code preliminarily provided to each protective relay are transmitted to the controller equipment 13 via communication line 12. In step S6, with respect to the operation of controller section 15, the operation status of protective relays Ry for detecting ground-fault is verified. Further, because the communication line 12 for signal transmission is usually utilized for another purpose, it is unpractical and lower the efficiency in use of the communication line 12 to transmit therethrough the operational status of the whole protective relays every time when forced grounding is performed for inspection. Therefore, it is more preferable such that the signal transmission is initiated on the condition that the high sensitivity protective relay installed in the substation referred to previously operates. Further, according to the above embodiment, the operational status of the protective relays Ry is transmitted. However, when there is a sufficient transmission capacity in the communication line 12, some appropriate signal transmission equipment may be disposed so as to transmit current values as detected instead of the status of the protective relays Ry. The communication line 12 may be one which utilizes the distribution line or a dedicated communication line separately provided thereto.

The deterioration position is determined in step S7 by collating respective identification codes preliminarily attached to the protective relays with the operational results transmitted so as to identify which protective relay has actually tripped. Further, according to this embodiment, the identification codes are attached in order to specify any position. The position, however, may be specified also by presetting the sequence of the relays in transmission of signals therefrom.

There are many ideas as to how to determine possible deterioration positions, and one of which is to assert an occurrence of a small grounding in a specific zone between two adjacent locations provided with protective relays Ry, when one of the relays is in an operational state while the other is in non-operational state. Namely, a fault occurrence zone is determined such that when there occurs a ground fault a zero-phase current flows from the distribution bus toward the fault point, whereas no zero-phase current flows at the load side of the fault point. Further, this technique is applicable also to the case of a zero-phase voltage. Further, as mentioned in Japanese Patent Application No. Hei 1-217366, when the distribution line is divided into a plurality of zones each provided with a sensor for detecting high frequency components contained in the fault current, the fault zone or point may be detected as the one where the sensor of which an output indicative to the detected high frequency components is largest is provided.

Upon determination of the fault point, the maintenance crew is dispatched for field survey and repairs thereof (step S9).

Another embodiment of the forcible grounding equipment 1 according to the present invention will be explained hereinafter. In contrast to the embodiment shown in FIG. 2 where the line-to-ground voltage determined by impedance Z is applied to the selected phase and the ground current flowing therethrough is suppressed accordingly, this embodiment shown in FIG. 6 comprises two grounding switches SW1 and SW2 and an impedance Z connected in parallel to the switch SW2. This operates as follows. By closing SW1 and SW2, a line-to-ground voltage $\sqrt{3}$ times as large as applied, then the switch SW2 is opened to suppress a large current to flow in case a short circuit should occur.

Figure 6:
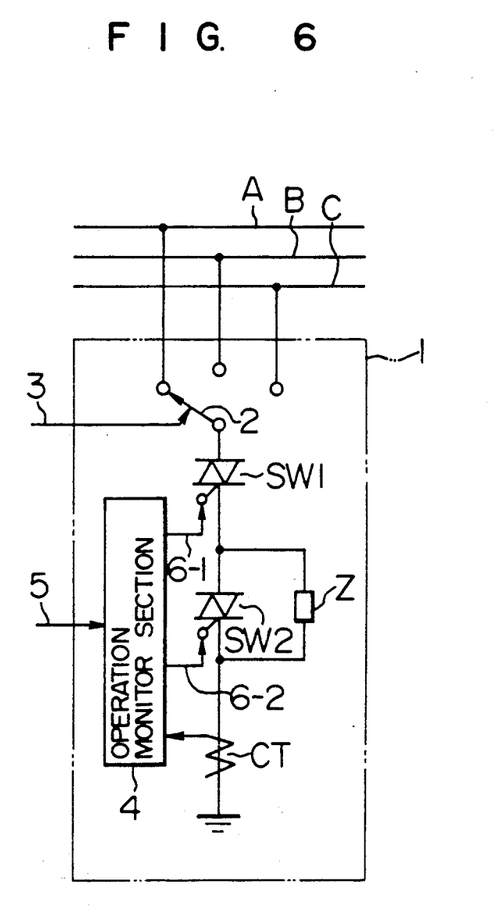
FIG. 6 shows another circuit configuration of an embodiment of forcible grounding equipment of the invention.

Further, as the state of current flowing through any deterioration point can be known utilizing the ground current obtained from the current transformer CT in any of the embodiments of the invention as shown in FIGS. 2 and 6, the state of deterioration by grounding at the deterioration point can be experimentally estimated by analyzing such current. Namely, according to the state of high frequency components contained in the current, it is possible to determine whether it is a discharge type ground fault or not. Further, by accumulating such data, any deteriorated equipment and materials and the mode of deterioration are expected to be specified.

FIGS. 7A, 7B, 8A, 8B, 9A and 9B show means for boosting the line-to-ground voltage of a specific phase by inserting an external voltage having selected phase and magnitude into the forced grounding circuitry 1.

Figure 7A:
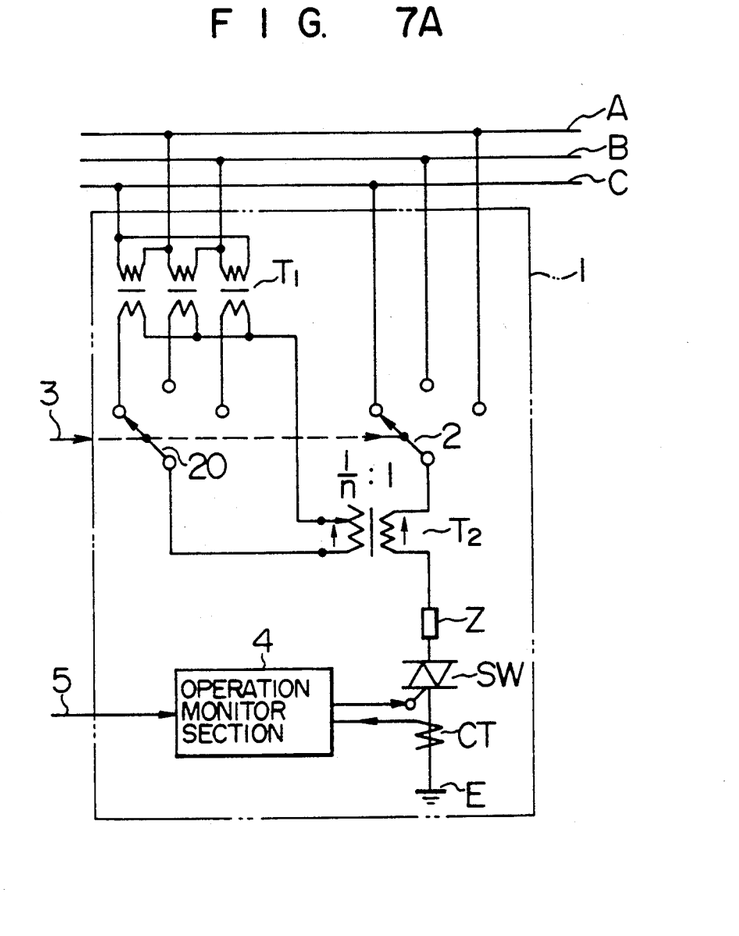
FIGS. 7A and 7B show a circuit block diagram implementing the embodiment of FIG. 6 and a vector diagram of the line-to-ground voltages of the respective phases.
Figure 7B:
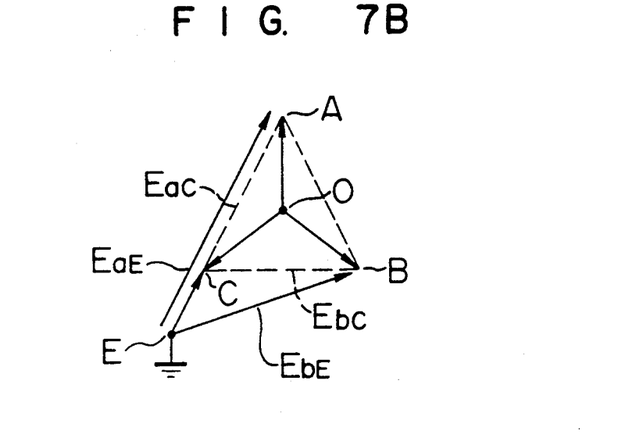

With respect to an example of FIG. 7A, the line-to-line voltages are taken out through a voltage transformer T1, and an optimum one of the voltages is selected by the phase select switch 20, and inserted into the grounding circuitry via a transformer T2. Here, the magnitude of the voltage can be changed, for example, by selecting winding ratio n of the transformer T2 through tap selection. In this occasion, as shown in the vector diagram of FIG. 7B, where the line-to-ground voltage of the phase A has been increased by forcibly grounding the phase C, the phase select switch 20 selects the line-to-line voltage between A-C phases, which is added to between E-C via the transformer T2 to obtain EaE. At this time, the line-to-ground voltage of the phase B increases from Ebc to EbE as shown in FIG. 7B.

Figure 8A:
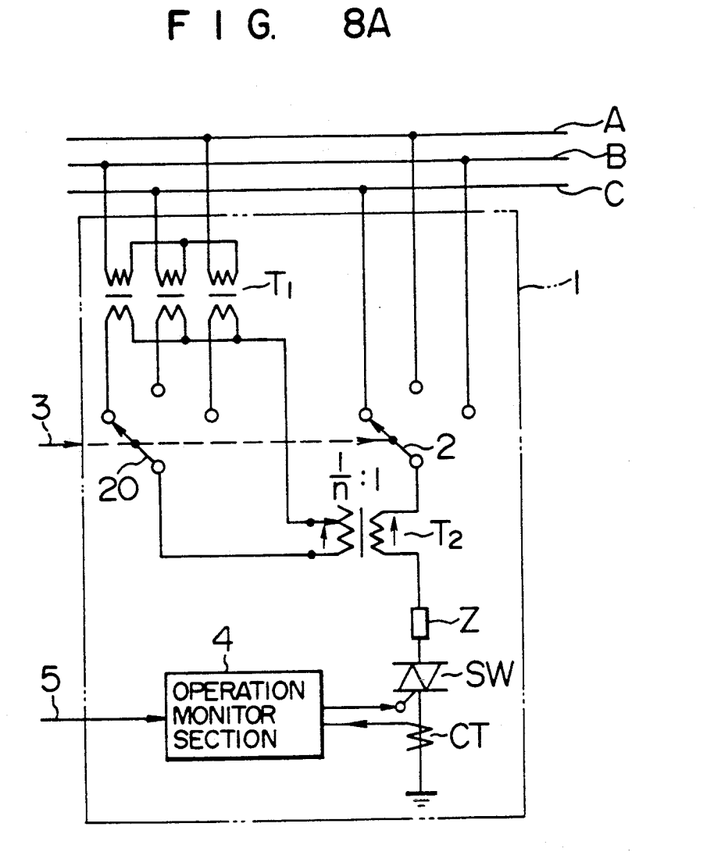
Figure 8B:
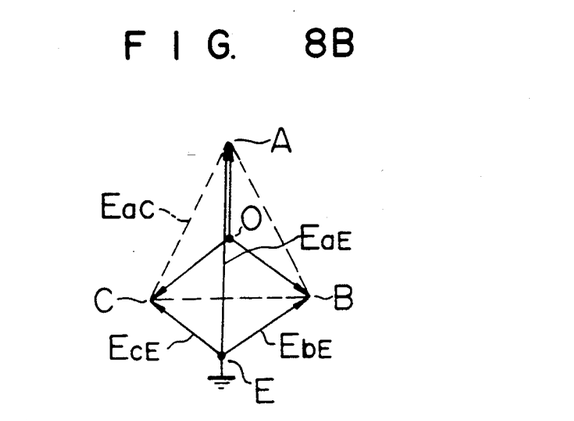
Figure 9A:
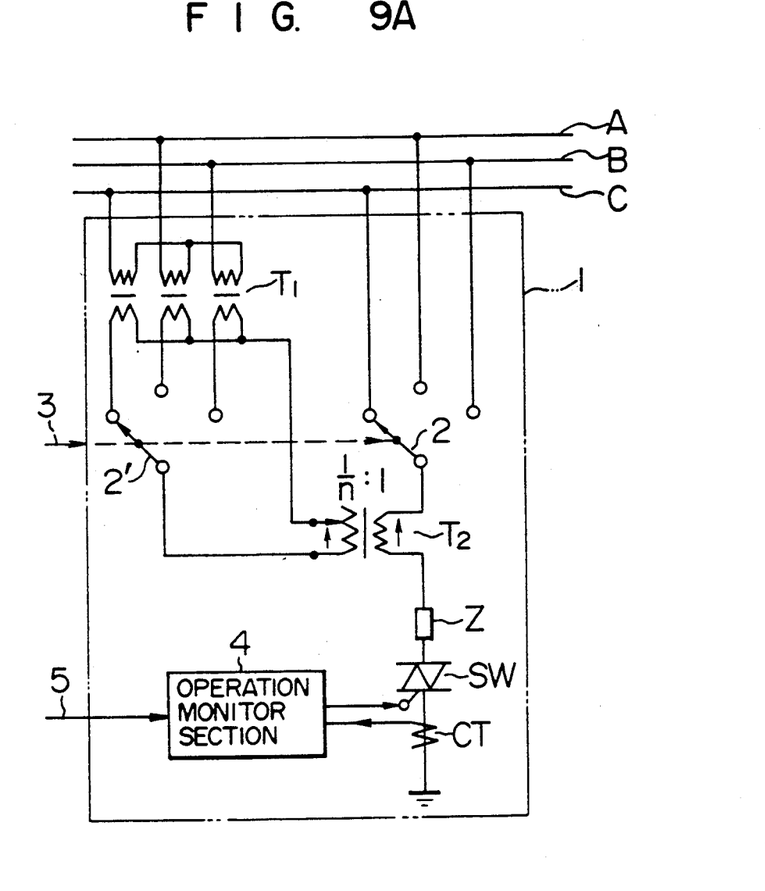
Figure 9B:
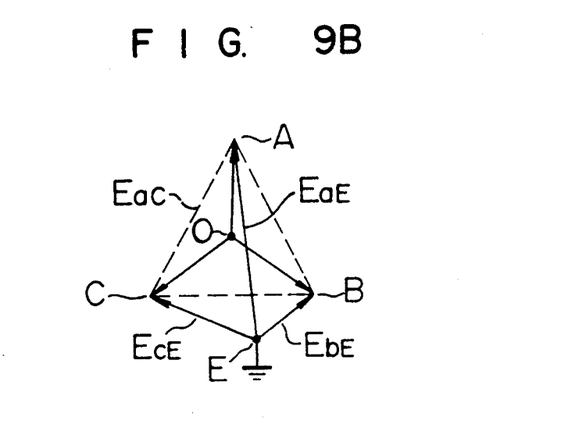

FIGS. 8A, 8B, 9A and 9B show other examples embodying the present invention in which the line-to-ground voltage of a selected phase is increased by the similar method. FIG. 8A shows the case where the phase voltage of the phase B is inserted between E-C after being transformed, thereby generating a line-to-ground voltage EaE for the phase A, EbE for the phase B and EcE for the phase C, thus accomplishing, as shown in FIG. 7B to increase the line-to-ground voltage only of the phase A. FIG. 9A shows the case where the phase voltage of the phase C is inserted between E-C via the transformer, and in the same manner as in FIG. 8A, only the line-to-ground voltage of the phase A is increased selectively as shown in FIG. 9B. As set forth hereinabove, the forcible grounding equipment of the invention functions to increase the line-to-ground voltage of any selected phase thereby intentionally causing breakdown of insulation-to-the-earth in the deteriorated equipment and materials on the selected phase until cognitive grounding signals are generated.

Further, a preferred period of time for performing the forced grounding according to the present invention should be very short, for example, for a period of several cycles as shown by T2 in FIG. 4 such that the conventional ground fault detection protective relays disposed on existing distribution lines will not be triggered erroneously. More particularly, it seems preferable to carry out the forced grounding for several cycles, and repeat this with an interval of several seconds.

Figure 10:
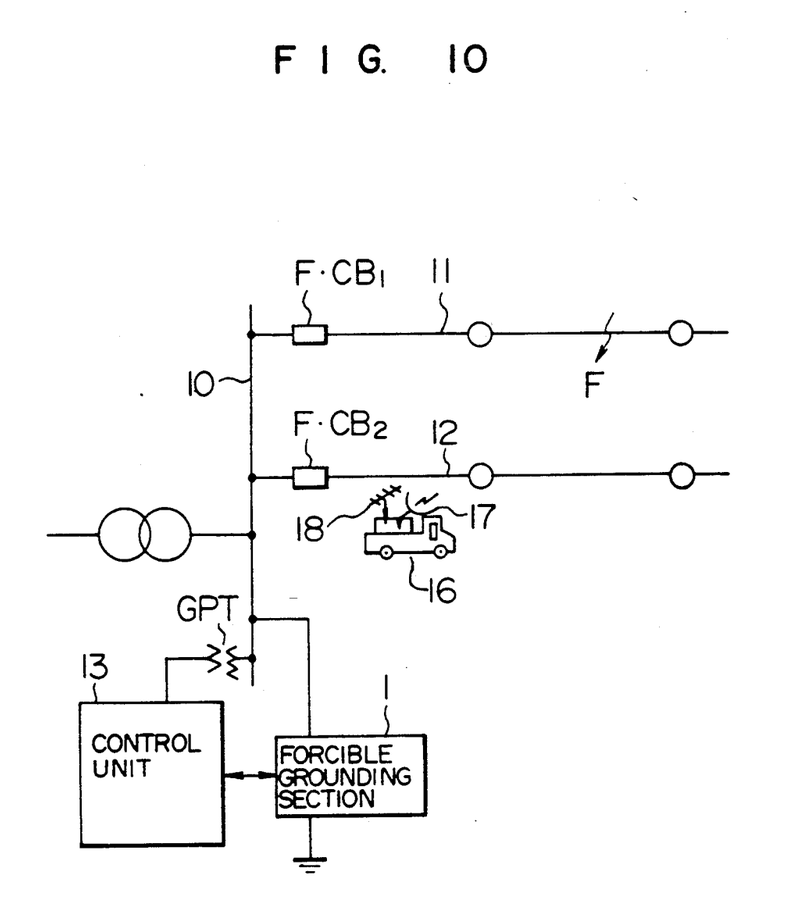
FIG. 10 shows a circuit diagram of means for detecting deteriorated equipment and materials.

Another method of detecting very small-scale grounding points in the system utilizing the above-mentioned forced grounding equipment 1 will be described below. FIG. 10 illustrates a method for determining a ground fault point F occurring under the forced grounding operation from emanating noises collected in the vicinity using acoustic sensors 17, antenna 18 mounted on a patrol car 16. By such means, any grounding fault may be readily detected through patrolling along the utility poles, thus eliminating lots of sensors and the like which would otherwise be required to be installed on the distribution lines. More particularly, it is capable of detecting a deteriorated point, for example, in the groups of insulators or of air circuit breakers and their related materials utilizing the above-mentioned prior art means.

Further, by way of the examples of the embodiments of FIGS. 1 and 2, the forcible grounding equipment is described as operated to locate the ground fault point, upon detection of the occurrence of a very small-scale ground fault by any appropriate means. This equipment, however, can be applied in combination to any distribution line operating normally at the time of periodical inspection thereby readily detecting any degraded or faults equipment or materials in advance. It can be clearly understood from what has been explained hereinabove that in the latter case, an initial inspection phase can be selected at discretion to be followed by other phases subsequently one by one. The phase select switch SW2 is not necessarily required to be installed because the same effect is expected to be attained by providing the forcible grounding switches SW respectively in two or three phases.

As heretofore set forth, according to the present invention, very small-scale grounding in the distribution lines and the like is capable of being detected without interrupting the power supply to the distribution lines, i.e., as energized.

Further, any location or spot where a very small-scale grounding is occurring is capable of being identified according to the present invention.

Further, should any unexpected short circuit fault occur during this small-scale grounding detection operation, adequate protection of the distribution lines is provided and assured.

We claim:

1. Grounding generation equipment for use with a three-phase power distribution system including at least one three-phase power distribution line, said equipment comprising: a series circuit of an impedance, a grounding switch and a first transformer, grounding phase select means for selecting one of three phases of the three-phase power distribution line and connecting said series circuit between the selected one phase of the distribution line under live wire condition and a ground potential, a second transformer connected to output three voltages corresponding to three line-to-line voltages of the three-phase distribution line and means for selecting one of the three voltages outputted from said second transformer and applying the selected one voltage to said first transformer.

2. Very small-scale ground occurrence detection equipment for use with a three-phase power distribution system including at least one three-phase power distribution line, said equipment comprising: forcible grounding means operative to connect a selected one of three phases of the three-phase distribution line under live wire condition to a ground potential, zero-phase current component detection means for detecting zero-phase current component of the three-phase distribution line and monitoring means for monitoring an output of the zero-phase current component detection means when said forcible grounding means is operated.

3. Very small-scale ground occurrence detection equipment for use with a three-phase power distribution system including at least one three-phase power distribution line, said equipment comprising: a series circuit of an impedance and a grounding switch, forcible grounding means for forcibly operating said grounding switch and connecting said impedance through the operated grounding switch between a selected one of three phases of the three-phase distribution line under live wire condition and a ground potential, zero-phase component detection means for detecting zero-phase component of the three-phase distribution line and monitoring means for monitoring an output of the zero-phase component detection means when said grounding switch is operated.

4. Very small-scale ground occurrence detection equipment for use with a three-phase power distribution system including at least one three-phase power distribution line, said equipment comprising: a series circuit of an impedance, a grounding switch and a first transformer, forcible grounding means for forcibly operating said grounding switch and connecting said impedance and said first transformer through the operated grounding switch between a selected one of three phases of the three-phase distribution line under live wire condition and a ground potential, a second transformer connected to output three voltages corresponding to three line-to-line voltages of the three-phase distribution line, means for selecting one of the three voltages outputted from said second transformer and applying the selected one voltage to said first transformer, zero-phase component detection means for detecting zero-phase component of the three-phase distribution line and monitoring means for monitoring an output of the zero-phase component detection means when said grounding switch is operated.

5. Very small-scale ground occurrence detection equipment for use with a three-phase power distribution system including at least one three-phase power distribution line, said equipment comprising: forcible grounding means operative to connect a selected one of three phases of the three-phase distribution line under live wire condition to a ground potential, a plurality of zero-phase component detection means provided at a plurality of locations in the three-phase distribution line for detecting zero-phase components at the locations, respectively, of the three-phase distribution line and monitoring means for receiving outputs of the zero-phase component detection means when said forcible grounding means is operated and specifying the location where very-small scale grounding occurs based on said received outputs.

* * * * *